United States Patent [19]

Genrich

[11] Patent Number: 4,556,984
[45] Date of Patent: Dec. 3, 1985

[54] FREQUENCY MULTIPLIER/DIVIDER APPARATUS AND METHOD

[75] Inventor: Thad J. Genrich, Morrison, Colo.

[73] Assignee: Motorola, Inc., Schaumburg, Ill.

[21] Appl. No.: 565,268

[22] Filed: Dec. 27, 1983

[51] Int. Cl.[4] .............................................. H03L 7/08
[52] U.S. Cl. ...................... 377/47; 307/271; 364/900
[58] Field of Search ............... 377/47, 48; 307/265, 307/271; 364/900

[56] References Cited

U.S. PATENT DOCUMENTS

| | | | |
|---|---|---|---|
| 3,729,623 | 4/1973 | Kelling | 377/47 |
| 3,859,737 | 5/1976 | Tanis | 377/48 |
| 4,101,838 | 7/1978 | Aihara et al. | 377/47 |
| 4,184,068 | 1/1980 | Washburn | 377/47 |

Primary Examiner—John S. Heyman
Attorney, Agent, or Firm—Raymond J. Warren

[57] ABSTRACT

Apparatus and method for generating an output signal as a function of an input, or reference signal. The apparatus consists of a numerically controlled oscillator having an output signal whose output frequency is determined by the input of a pair of frequency select inputs to the NCO. A control unit operates a multiplexer which allows one of the pair of frequency select inputs to be transmitted to the NCO. The increase in the number of variables provides an increase in the number of different step frequencies the FMD may be operated at.

7 Claims, 4 Drawing Figures

PHASED LOCKED LOOP

FIG. 3

$f_{ref} = 1\ MHz$

FMD (KHz)

| N | NCO (KHz) | FCD (KHz) | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| 1 | 62.5 | 1000 | X | 500 | 333 | 250 | 200 | 167 | 143 | 125 | 111 | 100 | 91 | 83 | 77 | 71 | 67 |
| 2 | 12.5 | 500 | X | X | 666 | 500 | 400 | 333 | 286 | 250 | 222 | 200 | 182 | 167 | 154 | 143 | 133 |
| 3 | 187.5 | 333 | X | X | X | 750 | 600 | 500 | 429 | 375 | 333 | 300 | 273 | 250 | 231 | 214 | 200 |
| 4 | 250 | 250 | X | X | X | X | 800 | 666 | 571 | 500 | 444 | 400 | 364 | 333 | 308 | 286 | 267 |
| 5 | 312.5 | 200 | X | X | X | X | X | 833 | 714 | 625 | 556 | 500 | 455 | 417 | 365 | 357 | 333 |
| 6 | 375 | 167 | X | X | X | X | X | X | 857 | 750 | 667 | 600 | 546 | 500 | 462 | 429 | 400 |
| 7 | 437.5 | 143 | X | X | X | X | X | X | X | 875 | 778 | 700 | 637 | 583 | 538 | 500 | 467 |
| 8 | 500 | 125 | X | X | X | X | X | X | X | X | 889 | 800 | 728 | 667 | 615 | 571 | 533 |
| 9 | 562.5 | 111 | X | X | X | X | X | X | X | X | X | 900 | 819 | 750 | 692 | 643 | 600 |
| 10 | 625 | 100 | X | X | X | X | X | X | X | X | X | X | 910 | 833 | 769 | 714 | 667 |
| 11 | 687.5 | 91 | X | X | X | X | X | X | X | X | X | X | X | 917 | 846 | 786 | 733 |
| 12 | 750 | 83 | X | X | X | X | X | X | X | X | X | X | X | X | 923 | 857 | 800 |
| 13 | 812.5 | 77 | X | X | X | X | X | X | X | X | X | X | X | X | X | 929 | 867 |
| 14 | 875 | 71 | X | X | X | X | X | X | X | X | X | X | X | X | X | X | 933 |
| 15 | 937.5 | 67 | X | X | X | X | X | X | X | X | X | X | X | X | X | X | X |

FREQUENCY MULTIPLIER/DIVIDER APPARATUS AND METHOD

BACKGROUND OF THE INVENTION

1. Field of the Invention

This invention relates, in general, to numerically controlled digital oscillators and more specifically to frequency multiplier/divider digital oscillators.

2. Description of Background Art

The traditional means of generating an output signal as a function of an input signal may be accomplished by either a frequency counter/divider (FCD) or a numerically controlled oscillator (NCO).

The FCD has a frequency transfer characteristic of $$f_{out} = f_{ref} \div N \qquad (1)$$

where N is the preset variable interval that the reference frequency ($f_{ref}$) is stepped at. This creates a problem at higher frequencies where the steps would by very large (e.g. at $f_{ref}=1$ MHz, $f_{out}=500$ KHz, 333 KHz etc. for N=2, 3 etc.). The FCD then is incapable of having great resolution for higher output frequencies relative to $f_{ref}$.

A second type of circuit that can adjust the frequency in this manner is disclosed in my pending application "Low Spurious Numerically Controlled Oscillator Apparatus and Method," Ser. No. 510,504. The NCO has a frequency transfer characteristic of $$f_{out} = f_{ref} \times (N/2^n) \qquad (2)$$

where N is again a preset variable interval and n is the fixed number of bits in the word defining N. Taking n as a four-bit word the above equation then becomes, $$f_{out} = f_{ref} \times (N/16) \qquad (3)$$

which gives more control of the stepping interval than the FCD does, but, which lacks variability in the denominator function as the demoninator can only be powers of two (e.g., $2^n = 4, 8, 16$ etc. for n=2, 3, 4, etc.).

Neither the NCO nor the FCD have the resolution required at high frequencies because of their large step functions and/or lack of variability.

SUMMARY OF THE INVENTION

Accordingly, it is an object of the present invention to provide a numerically controlled digital oscillator apparatus capable of operating with increased resolution at higher frequencies.

It is further an object of the present invention to provide a numerically controlled digital oscillator apparatus wherein its step function is more finely controlled.

Another object of the present invention is to provide a numerically controlled digital oscillator apparatus that, when utilized as a feedback device in a phased locked loop, enables the use of a reference signal much larger than the channel spacing.

Still another object of the present invention is to provide a numerically controlled digital oscillator apparatus that enables the use of fixed prescalars.

The above and other objects and advantages of the present invention are provided by a frequency multiplier divider (FMD) apparatus wherein the digital output signal ($f_{out}$) is utilized to generate a digital signal of the correct frequency. The FMD has a frequency transfer characteristic of, $$f_{out} = f_{ref} \times (N/D) \qquad (4)$$

where N is a preset variable interval, as above, and D is a preset variable in the range of $N < D < 2^{n-1}$ where n is the number of bits in the word defining N. Taking N as a five bit word, a four-bit word and a sign bit, then n is five and $2^{n-1}$ becomes 16. Variable D is then in the range $N < D < 16$, which gives N/D a possibility of 106 different steps rather than 16 as in the NCO and FCD systems.

BRIEF DESCRIPTION OF THE DRAWINGS

FIG. 3 is a chart of step frequencies for the numerically controlled oscillator, a frequency counter/divider and the frequency multiplier/divider embodying the present invention in FIG. 1.

DETAILED DESCRIPTION

Figure 1:
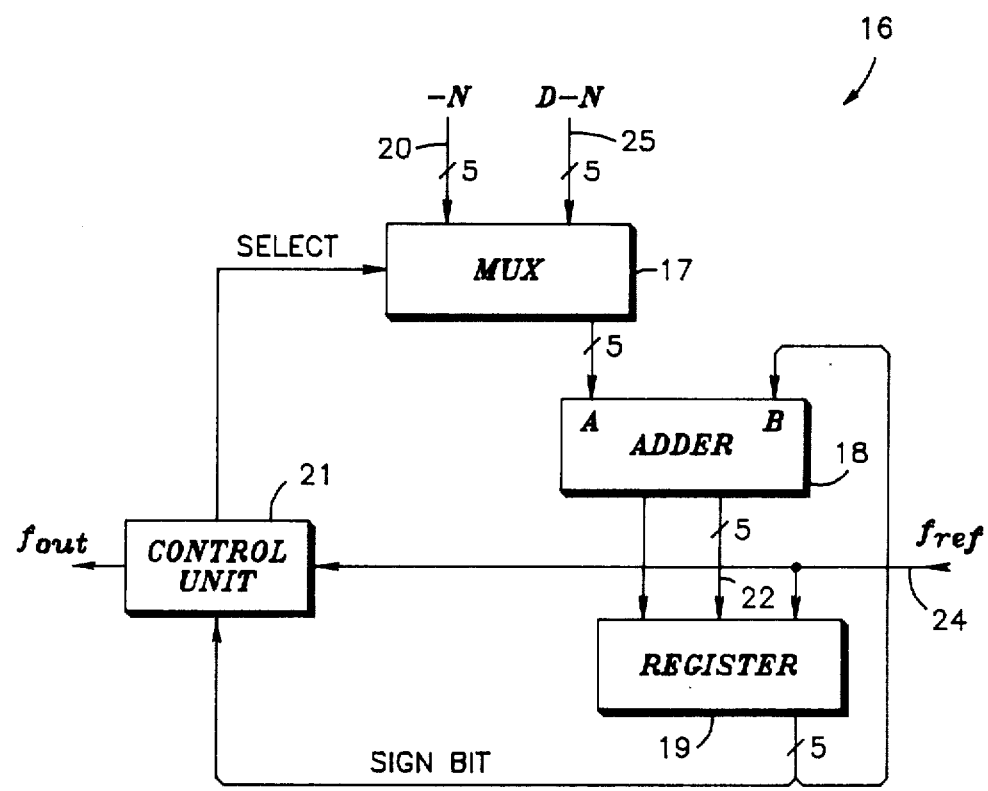
FIG. 1 is a block diagram of a frequency multiplier/divider embodying the present invention.

Referring now to FIG. 1, a simplified block diagram of an FMD, generally designated 16, embodying the present invention is illustrated. FMD 16 includes a dual input multiplexer 17, a dual input adder 18, a register 19 and a control unit 21. A five-bit parallel input comprising a four-bit word and a sign bit $-N$ (or 2's complement of N) is input to multiplexer 17 on a line 20 and is utilized for frequency selection. A second five-bit parallel input comprising a four-bit word and a sign bit $D-N$ is input to multiplexer 17 on a line 25 and is also utilized for frequency selection. A five-bit parallel output of multiplexer 17 is connected to an input port, A, of adder 18. Multiplexer 17 further has a select input for selecting the set of data, $-N$ or $D-N$, to pass through multiplexer 17 and output to adder 18.

Adder 18 receives a five-bit parallel input, to input B, comprising a four-bit word and a sign bit, from register 19, which is added to input A from multiplexer 17. The sum of the inputs, $A+B$, is output from adder 18 on a bus 22.

Register 19 is operated by a clock signal, $f_{ref}$, carried on a line 24. The clock signal on line 24 causes the data contained on bus 22 to be loaded into register 19. Register 19 has an output, a four bit word and a sign bit, connected to the B input of adder 18. The sign bit output of register 19 is also connected to control unit 21.

Control unit 21 receives a clock input $f_{ref}$ from line 24 that loads the sign bit from register 19. Control unit 21 outputs a signal, $f_{out}$, on a line 26 and the select signal to multiplexer 17 for selecting which of the two inputs, $-N$ or $D-N$, are to enter multiplexer 17, this process will be described more fully in conjunction with FIG. 2.

A simplified example of the operation of FMD 16 is presented below. In this example, the register contents are represented in digital and decimal values. Each line of the sequence represents one pulse from $f_{ref}$. The values N=3 and D=7 have been arbitrarily chosen, therefore $-N = -3$ and $D - N = 4$.

| $f_{ref}$ Pulse | Register Value (Binary) Sign | Word | Register Value (Decimal) | MJX Output | $f_{out}$ Pulse |
|---|---|---|---|---|---|
| 1 | 0 | 0000 | 0 | −3 | |
| 2 | 1 | 1101 | −3 | 4 | 1 |
| 3 | 0 | 0001 | 1 | −3 | |
| 4 | 1 | 1110 | −2 | 4 | 2 |
| 5 | 0 | 0010 | 2 | −3 | |
| 6 | 1 | 1111 | −1 | 4 | 3 |
| 7 | 0 | 0011 | 3 | −3 | |

Here the register value is illustrated starting at 0 which, through the sign value, causes the control unit to transmit a select signal to multiplexer 17 which allows −3 to pass through to adder 18. The output from multiplexer 17, −3, is added to the output from register 19, 0, to form the new register value, −3, which is stored in register 19 on the next pulse from $f_{ref}$.

An example of one step of the above can be illustrated where the register value is −3. When the register value is −3 a sign bit is high (1) which causes the multiplexer output to be 4 and a output pulse, $f_{out}$, to be generated from control unit 21.

Figure 2:
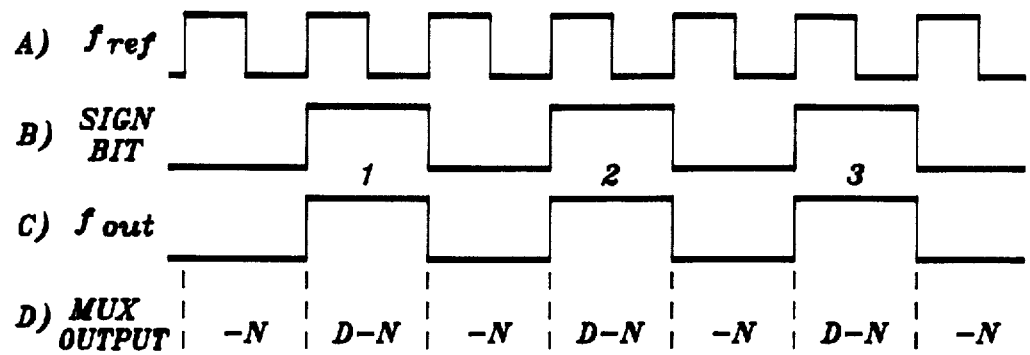
FIG. 2 is a signal diagram of the frequency multiplier/divider of FIG. 1 embodying the present invention.

Referring now to FIG. 2 a signal diagram of the above described example is illustrated. FIG. 3A illustrates the input signal, $f_{ref}$. Line B shows the sign bit and line C shows the corresponding $f_{out}$ signal from control unit 21. As shown in line C $f_{out}$ has only three pulses to $f_{ref}$'s seven pulses, this makes $f_{out} = f_{ref} 3/7$ which is the predicted value (N/D). Line D illustrates the output of multiplexer 17 through the transition of the register values. When a carry bit is transmitted from register 19 to control unit 21 a select signal is transmitted to multiplexer 17, where the D−N input is selected, and an $f_{out}$ signal is generated, as illustrated by line C. Where there is no carry bit transmitted from register 19 to control unit 21 then the select signal, transmitted to multiplexer 17, selects the −N input to pass through to adder 18 and no $f_{out}$ signal is generated.

Referring to FIG. 3, a chart of the step frequencies is illustrated comparing the NCO, FCD and FMD oscillators as a function of N, a preset four-bit variable input word, or four-bit and a sign bit for the FMD. Taking $f_{ref}$ as 1 MHz then NCO steps at 62.5 KHz intervals giving a selection of only 15 step frequencies as N varies from 1 to 15. The FCD, while stepping at various intervals, also provides only 15 step frequencies. The FMD is shown as a function of N and D, which contains 106 step functions ranging from 0 Hz to 933 KHz.

Figure 4:
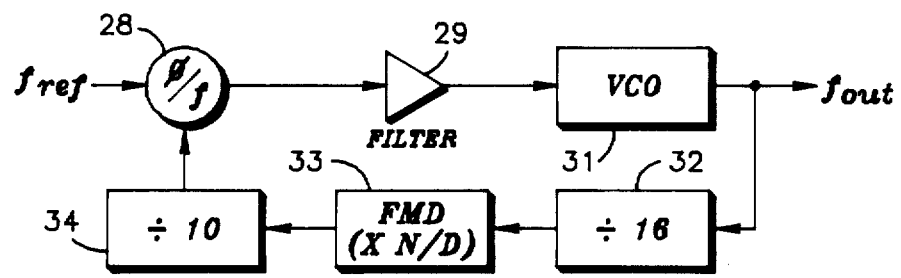
FIG. 4 is a block diagram of a phase locked loop embodying the present invention.

Referring now to FIG. 4 a block diagram of a phase locked loop (PLL), generally designated 27, embodying the present invention is illustrated. A reference signal, $f_{ref}$, is input to a phase detector 28 which detects the phase difference between $f_{ref}$ and the input from the feedback line. The signal from phase detector 28 is transmitted through a filter 29 to a voltage controlled oscillator (VCO) 31. The signal from VCO 31, $f_{out}$, is then output from PLL 27 and also connected to a prescaler 32, divide by 16. The signal from prescaler 32 is then transmitted to an FMD 33 where it is multiplied by N/D. The variables N and D are preselected with the restriction that $N < D < 2^{n-1}$ where n is the number of bits used to define the N (or D) variable including the sign bit. In FIG. 4 n is 17 making $N < D < 65,536$. This FMD output is transmitted to a divide by ten circuit 34 to reduce unwanted spurious signals. The output from circuit 34 is then transmitted to phase detector 28 where it interacts with $f_{ref}$.

In the circuit described in FIG. 5 output signal $f_{out}$ is defined by, $$f_{out} = \frac{f_{ref}(10)(D)(16)}{N} \quad (5)$$

and for various parameters would be as follows:

EXAMPLE

Taking N = 16,000 and $f_{ref}$ = 1 MHz then $f_{out} = 10 \times D$ KHz and for $16,000 < D < 65,536$ then $160 \text{ MHz} < f_{out} < 655 \text{ MHz}$ at 10 KHz steps.

Thus, when utilized as a feedback device in a phased locked loop the present invention enables the use of a reference signal much larger than the channel spacing.

Accordingly, it has been shown that the present invention provides a numerically controlled oscillator capable of operating with increased resolution at higher frequencies.

It has been shown, further, that the present invention provides a numerically controlled oscillator where the step function is more accurately controlled.

It has also been shown that the present invention provides a numerically controlled oscillator that, when utilized as a feedback device in a phased locked loop, enables the use of a reference signal much larger than the channel spacing.

It has also been shown that the present invention provides a numerically controlled oscillator that enables the use of fixed prescalars.

Thus it is apparent that there has been provided, in accordance with the invention, a device and method that fully satisfies the objects, aims and advantages set forth above. While the invention has been described in conjunction with specific embodiments thereof, it is evident that many alterations, modifications, and variations will be apparent to those skilled in the art in light of the foregoing description. Accordingly, it is intended to embrace all such alternatives, modifications, and variations as fall within the spirit and broad scope of the appended claims.

I claim:

1. Clocked frequency multiplier/divider (FMD) apparatus, having first and second frequency select inputs and a reference frequency input, said apparatus comprising:

an adder having a first input, a second input, an output and a carry output;

a register having an input, a carry input, a clock input, a carry output and an output, said input being coupled to said output of said adder, said carry input being coupled to said carry output of said adder, said clock input being coupled to said reference input of said FMD and said output being coupled to said second input of said adder;

selecting means for selecting one of said first and second frequency select inputs of said FMD;

control means for controlling said selecting means; and an output having a predetermined relationship to said reference frequency input.

2. The FMD of claim 1 wherein said selecting means comprises a multiplexer having a first input, a second input, a select input and an output, said first input being coupled to said frequency select input of said FMD, said second input being coupled to said second frequency select input of said FMD, and said output being coupled to said first input of said adder.

3. The FMD of claim 2 wherein said control means comprises a control unit having a carry input, a clock input, an output and a select output, said carry input being coupled to said carry output of said register, said clock input being coupled to said reference frequency input of said FMD, said output being coupled to said output of said FMD and said select output being coupled to said select input of said multiplexer.

4. A method of providing an output signal from a frequency multiplier/divider (FMD) at a desired frequency comprising the steps of:
   transmitting one of a first and a second frequency select inputs to an adder;
   adding said one of said first and said second frequency select inputs to an output word from a register to produce an output word with a carry bit from said adder;
   loading said output word and said carry bit of said adder to said register on a clock pulse;
   transmitting said output word of said register to said adder and transmitting a carry bit from said register to a control unit on said clock pulse;
   selecting one of said first and second frequency select inputs for transmitting to said adder; and
   producing an output signal on a clock signal.

5. The method of claim 4 wherein said providing one of said first and said second frequency select inputs to said adder comprises the steps of:
   providing first and second frequency select inputs to a multiplexer; and
   selecting one of said first and said second frequency select inputs to pass through said multiplexer to said adder.

6. The method of claim 5 wherein said selecting of one of said first and second frequency select inputs for transmitting to said adder comprises the steps of:
   producing a select signal; and
   transmitting said select signal to said multiplexer to select said one of said first and said second frequency select inputs, on said clock pulse.

7. A frequency multiplier/divider (FMD) apparatus, having a first and second frequency select inputs, a reference frequency input and a frequency output, said apparatus comprising:
   a multiplexer having a first input, a second input, a select input and an output, said first input being coupled to said first frequency select input of said FMD and said second input being coupled to said second frequency select input of said FMD;
   an adder having a first input, a second input, an output and a carry output, said first input being coupled to said output of said multiplexer;
   a register having an input, a carry input, a clock input, a carry output and an output, said input being coupled to said output of said adder, said carry input being coupled to said carry output of said adder, said clock input being coupled to said reference frequency input of said FMD and said output being coupled to said second input of said adder; and
   a control unit having a carry bit input, a clock input, an output and a select output, said carry bit input being coupled to said carry bit output of said register, said clock input being coupled to said reference frequency input of said FMD, said output being coupled to said frequency output of said said FMD and said select output being coupled to said select input of said multiplexer.

* * * * *